United States Patent [19]

Ellis, Jr.

[11] Patent Number: 5,393,563
[45] Date of Patent: Feb. 28, 1995

[54] FORMATION OF TIN OXIDE FILMS ON GLASS SUBSTRATES

[76] Inventor: Frank B. Ellis, Jr., 42 Montadale Cir., Princeton, N.J. 08540

[21] Appl. No.: 87,033

[22] Filed: Jul. 6, 1993

Related U.S. Application Data

[63] Continuation-in-part of Ser. No. 784,578, Oct. 29, 1991, abandoned.

[51] Int. Cl.$^6$ .............. C23C 16/40; B05D 5/06; C03C 17/245
[52] U.S. Cl. .................. 427/248.1; 427/167; 427/255; 427/255.3; 65/60.5
[58] Field of Search ............ 427/248, 255, 255.1, 427/255.3, 167; 65/60.1, 60.5; 118/718, 719, 729

[56] References Cited

U.S. PATENT DOCUMENTS

| | | |
|---|---|---|
| 2,566,346 | 9/1951 | Lytle et al. |
| 3,107,177 | 10/1963 | Saunders et al. |
| 3,677,814 | 7/1972 | Gillery |
| 3,790,404 | 2/1974 | Garnache et al. ............ 117/106 R |
| 3,841,858 | 10/1974 | Akashi et al. ............ 65/181 |
| 3,850,679 | 11/1974 | Sopko et al. ............ 117/106 R |
| 4,206,252 | 6/1980 | Gordon ............ 427/166 |
| 4,293,326 | 10/1981 | Terneu et al. |
| 4,500,567 | 2/1985 | Kato et al. ............ 427/255.3 |
| 4,547,400 | 10/1985 | Middleton et al. ............ 427/160 |
| 4,590,096 | 5/1986 | Lindner |
| 4,600,654 | 7/1986 | Lindner |
| 4,612,217 | 9/1986 | Gordon ............ 427/255.1 |
| 4,737,388 | 4/1988 | Lindner |
| 4,743,506 | 5/1988 | Russo et al. ............ 427/160 |
| 4,788,079 | 11/1988 | Lindner ............ 427/166 |
| 4,857,361 | 8/1989 | Bloss et al. ............ 427/109 |
| 4,878,934 | 11/1989 | Thomas et al. |
| 4,880,664 | 11/1989 | O'Dowd et al. ............ 427/109 |
| 4,920,917 | 5/1990 | Nakatani et al. ............ 118/718 |
| 4,946,712 | 8/1990 | Goodman et al. ............ 427/166 |
| 5,102,691 | 4/1992 | Russo et al. ............ 427/109 |
| 5,122,391 | 6/1992 | Mayer ............ 427/126.3 |
| 5,124,180 | 6/1992 | Proscia ............ 427/255.3 |

OTHER PUBLICATIONS

Gralenski, Nicholas M., "Thin Films by Conveyorized Atmospheric CVD," *ISHM–Internepcon Technical Seminar*, Tokyo, Japan, Jan. 18, 1983.

Primary Examiner—Shrive Beck
Assistant Examiner—Bret Chen
Attorney, Agent, or Firm—Watov & Kipnes

[57] ABSTRACT

Apparatus and method for forming a metal oxide film on a glass substrate in which ambient air and particularly water vapor is prevented from reaching the initial nucleation site by injection of dry gas at a point such that ambient air is excluded from the area around the upstream edge of the injector where the film first starts to be formed. Crystal growth inhibiting gas is injected so as to reach only the initial nucleation site to improve the nucleation process, thereby improving film properties without decreasing the overall film thickness. Application of the above methods in the deposition of tin oxide yields improved haze control of the tin oxide film, including very low haze coatings.

14 Claims, 4 Drawing Sheets

FORMATION OF TIN OXIDE FILMS ON GLASS SUBSTRATES

This is a continuation-in-part application of U.S. patent application Ser. No. 07/784,578, filed on Oct. 29, 1991, now abandoned.

BACKGROUND OF THE INVENTION

Films of tin oxide are used on window glass to reflect infrared rays so as to keep a building cooler in the summer and warmer in the winter. For best results, the film should be relatively thick, about one-half a micron, but it is difficult to form such films that are not so rough as to diffuse light and produce an unsatisfactory hazy appearance. On the other hand, in hydrogenated amorphous silicon photovoltaic applications, a given amount of diffusion is desirable because it increases the efficiency.

The reactants from which the tin oxide film can be formed include organotins such as tetramethyl tin and tin chlorides such as dimethyl tin dichloride and tin tetrachloride also known as stannis chloride. Although tetramethyl tin more readily forms a smoother film, it yields a more limited film growth rate, and it has a dangerous subtle accumulative toxic effect on persons exposed to it. Water is not required when tetramethyl tin or dimethyl tin dichloride are used since oxygen is typically used as the oxidizing agent. However, it is required when the tin tetrachloride is used in order to obtain large growth rates below 700° C.

It is known that the addition of an appropriate fluorine containing compound to the reactant gases from which tin oxide is deposited principally causes lower emissivity so as to increase reflection of infrared energy. In addition, it decreases the film roughness so as to reduce diffusion and the resulting hazy appearance. Unfortunately, however, fluorine compounds slow down the growth rate of the polycrystalline structure forming the tin oxide film making it more difficult to obtain adequately thick films.

In machines for forming a film of tin oxide on a substrate such as soda lime glass coated with silicon dioxide, the substrate is continuously moved through a deposition zone by passing it under an injector that brings the reactants in contact with the substrate by vapor deposition or by means of a spray nozzle. When tin tetrachloride is used, a desired amount of water is included in the reactants. In some machines the substrate is moved on a belt, in others on rollers, and in still others on molten tin. Exhaust ports are provided at both the upstream and downstream ends of the injector so as to remove by-products and any excess reactants. It is also customary to provide baffles adjacent the exhaust ports for reducing the turbulence in any gases that are drawn to the exhaust ports from the ends of the machine where the substrate enters and departs. In furnaces where the substrate rides on rollers or belts, these gases are ambient air, but in machines where the substrate rides on molten tin, the gases consist of a reducing atmosphere, generally nitrogen plus a small amount of hydrogen, so as to prevent the tin from being oxidized.

A number of theories have been advanced as to the reasons for the roughness of the tin oxide film, but these have overlooked an important method whereby it can be reproducibly controlled and reduced (if so desired). In the case of window glass, it would be advantageous to reduce or control the roughness, and, in the case of photovoltaic application, it would be advantageous to be able to vary the amount of roughness or haze to obtain a desired haze.

A brief description of teachings in a number of known references will now be given.

Lytle et al. No. 2,566,346 teaches a tin oxide composition useful for coating glass and other objects. The tin oxide composition and method of application provides a very high electrical conductivity for permitting the conduction of an electrical current therethrough. The coating is applied to glass heated to temperatures above 400° F., but below the melting point of the glass. A solution of dissolved tin and water soluble fluoride is used in the process.

Saunders et al. No. 3,107,177 teaches a family of filming compositions and methods for producing tin oxide films that have high transparency, high electro-conductivity, and provide good electrical contact surfaces. The composition is applied to heated glass sheets.

Gillery No. 3,677,814 teaches the forming of transparent electro-conductive tin oxide films on glass via pyrolyzation of an organic tin fluoride solution having a direct tin-fluoride bond.

Terneu No. 4,293,326 teaches a process for applying a coating of tin oxide to glass. The glass is moved through coating apparatus in a zone where a gaseous medium of tin tetrachloride and water vapor contacts the glass face, and coats the same. The gas is at a temperature of about 300° C., and the surface of the glass at 550° C. Note in column 1 it is indicated that in the literature for prior systems "that the presence of water in the atmosphere where the coating formation occurs promotes the speed of film formation but . . . the water content of the atmosphere in which spraying takes place must be in all cases be less that 0.01 pounds per pound of air." Note in column 2, line 52 through 56 that "the present invention is based on the discovery that the strict limitation on the concentration of water vapor is not necessary provided that there is sufficient concentration of tin tetrachloride in gaseous medium from which the deposition of tin oxide occurs." Note also in column 4, line 18 that "it is preferable for the tin tetrachloride and water vapor to be supplied to the coating zone in separate gas streams so that they come into contact in the vicinity of the substrate face being coated. By this procedure premature reaction of the tin salt, causing solid deposits in the interior of a vapor feed passage can be avoided." Note in column 5, beginning on line 67 that "Nitrogen preheated to 500° C. was fed from a source (not shown) along the duct 10 so as to serve as a kind of pneumatic screen isolating the passageway 13 from the gasses located in the compartment 4 and externally of the shroud 14." Note in column 6, beginning on line 10, that "The duct 12 is continuously supplied with a gas mixture at 450° C. and comprising air, water, vapor and hydrofluoric acid . . . ".

Lindner No. 4,590,096 is entitled "Water Vapor, Reaction Rate and Deposition Rate Control of Tin Oxide Film by CVD on Glass". As indicated in the Abstract, the method includes providing a "gas stream containing sufficient water vapor such that its relative humidity at 18° C. is about 6 percent to 100 percent. The liquid coating composition is indicated as comprising monobutyltin trichloride and trifluoroacetic acid." Note in column 5, line 26 that "Method A—dry air under controlled pressure and flow in one half inch stainless steel (SS) is passed in separate streams through a gas dryer and a water bath. The air emerging from the streams, which now contains a fixed amount of water vapor, is combined and passed through a heated oil bath and then a heated metal mixing chamber where the organotin composition is vaporized as it is injected at a controlled rate . . . ". Note further in column 5, line 43, that "Method B—Air under control pressure and flow in one half inch SS tubing is passed through a gas dryer and a water trap, combined and then passed through an in-line hygrometer. The air of known water content then passes through an electric heater into an expansion chamber one half inch in diameter. The organotin composition is injected into a nitrogen swept heated injection block at a controlled rate where it is immediately vaporized and passes into the hot-stream at the beginning of the expansion chamber. The heated mixture of air, water vapor and dopant compound now passes through a vertical tube of the same diameter enclosed in a two inch hot air insulated tube and impinges on a glass slide heated in the same manner as in Method A . . . ". In column 8, note on line 61 "Example 41" it is indicated that "The affect of Relative Humidity on deposition rate of stannic oxide was evaluated. The method of Example 1 method A and B were used to deposit the film. The results are shown in Tables IV and V. The data show that an increase in RH will generally increase the deposition rate. The relative magnitude of the increase is dependent on such parameters as additional rate and air flow." Note in column 9, line 36 "Example 45" that "the water sensitivity of the TFA dopant-MBTC system was studied using the method of Example 38. . . ".

Lindner No. 4,600,654 teaches a method for producing haze-free tin oxide coatings on glass. As indicated in column 1, beginning on line 59, "liquid monophenyltin trichloride is of low corrosivity and of low toxicity, and is rapidly decomposed in air at an elevated substrate temperature to provide a transparent, haze-free tin oxide coating . . . ". Note in column 2, beginning on line 13, the indication that "Accordingly, a carrier gas 10 which includes oxygen is metered through a feedline 11 at a predetermined flow rate through an air dryer tower 12 to provide a stream 13 of dry air. A separate airstream may be directed through a humidifier 14 containing a suitable quantity of water 15 to provide a wet airstream 16 at a desired relative humidity. Thereby in airstream 17, either dry or wet, may be passed through an evaporator 18 containing vessel 19 for holding liquid monophenyltin trichloride. The liquid is supplied to evaporator 18 by syringe pump 20 and syringe 21. The airstream is heated from an oil bath (not shown) to a desired vaporization temperature." Note also on line 47 that "The carrier gas may be dry or wet; preferably water vapor concentration is less than 10 moles of water per mole of monophenyltin trichloride."

Lindner, No. 4,737,388 teaches a system for producing transparent, non-iridescent, infrared-reflecting glass window structures which are haze-free. It does not appear that the teachings of this patent are concerned with the role of water vapor relative to hazing and coating glass sheets with tin oxide.

Lindner, No. 4,788,079 teaches a similar system to that of No. 4,737,388 for producing haze-free tin oxide coatings on glass. An air dryer tower 12 is used to provide a stream 13 of dry air. Also, a separate airstream is directed through a humidifier 14 for providing a predetermined wet airstream 16 of desired relative humidity. Either one of the dry or wet airstream 17 is passed through an evaporator 18 containing vessel 19 for holding liquid monophenyltin trichloride. Note in column 4, line 65 it is indicated that "The reason that haze-free tin oxide coatings can be produced using haze-free monophenyltin trichloride as an undercoat is not well understood at present . . . ".

Thomas et al. No. 4,878,934 teaches an apparatus for pyrolytically forming a metal oxide coating on an upper face of a heated glass substrate. Note from the figures it appears that an injector head type coating apparatus on a continuous line is used in the process and apparatus of the invention taught. Note in column 18, line 41, Example 3, that "An aqueous solution of stannous chloride containing ammonium bifluoride was discharged at a rate of . . . ".

O'Dowd et al. 4,880,664 teaches a method for forming a textured layer of tin oxide on a vitreous substrate. It is indicated in the abstract, that the method "comprises the steps of depositing a first film of tin oxide on the substrate by chemical vapor deposition from a first reactant mixture of tin chloride, water, and an alcohol and depositing a second film of tin oxide on the first tin oxide film by chemical deposition from a second reactant mixture of tin chloride and water. Note in column 4, beginning on line 1 that "The first step includes depositing a first film of tin oxide on a substrate by chemical vapor deposition (CVD) reaction between tin chloride and water that is moderated by the addition of trace amounts of alcohol to the reaction. The second step includes depositing a second film of tin oxide on the first tin oxide film by CVD from a reactant mixture of tin chloride and water without moderation with alcohol." In column 4, line 63, it is indicated that the substrate 30 is held at a preselected reaction temperature during the deposition thereon of a chemical vapor from a first reactant mixture of tin chloride, water, and an alcohol.

BRIEF DESCRIPTION OF THE INVENTION

After the deposition of the film first starts on the substrate at the upstream edge of the injector, the coating gradually builds up to its steady thickness as the substrate advances the width of the injector. In other words, that part of the substrate which was at the upstream edge of the injector when the coating started advances to the downstream edge of the injector. The inventor has observed that there may be an abrupt increase in haze commencing where the nucleation of the coating first occurred at the upstream edge of injector. The haze can easily more than triple. Thus, the steady state coating is much hazier than just before steady state is reached. The increased haziness is not due to increased thickness since the coating has the same thickness just before and after the markedly increased haziness. Eliminating the source of this increased haze would yield a product with a much lower haze. The inventor has discovered that the roughness of the film is due to the nature of the very tiny nascent crystallites formed on the substrate during nucleation just upstream of the injector, and that this is due to the presence of water vapor that is carried in by the ambient air.

It has been observed that during the growth of tin oxide from tin tetrachloride a very large water vapor concentration with respect to the tin tetrachloride concentration yields very rough films. In addition, the inventor has surprisingly discovered that excess water concentration need not be present during the entire or even most of the growth of the film. It need only be present during the initial nucleation of the film onto the substrate surface. In the prior art, ambient air mixes in the region of the exhaust and upstream edge of the injector head where the film first starts to nucleate on the substrate. The moisture in the ambient air, depending on humidity, can yield an extremely large water to tin tetrachloride concentration, thereby, producing a condition which constrains the film to become rough as it thickens. For example, if ambient air is at 22° C. and 77% relative humidity, then it is about 2% water vapor by volume. In the deposition of tin oxide from tin chloride and water vapor, one frequently uses about 2–3% water vapor by volume. However, the ambient air drawn in by the exhaust frequently makes up a substantially larger fraction of the total exhaust gases than deposition gases. Thus, the mixing of ambient air drawn into the exhaust with the deposition gases may have little affect on the water vapor concentration, but will significantly reduce the tin chloride concentration. By analogy, in the deposition process, the nascent crystallites are like "seed" crystallites carrying the code which to a great extent determines the properties of the large crystallites, including roughness, in the thick film. Accordingly, as indicated above, the present inventor discovered that moisture drawn into the nucleation site or area can produce the large crystallites, causing roughness or hazing in the thick film. He further discovered that by blocking ambient air from being drawn into the nucleation site or area, hazing can be minimized in the thick film. He also discovered that by both blocking ambient air, and controlling the water or moisture about the nucleation site or area, hazing can be controlled or varied within a range.

In furnaces where the substrate moves on rollers, ambient moist air is prevented from reaching the nucleation site at the upstream edge of the gas injector, in one embodiment of the invention, by the additional injection of dry gas under the upstream baffle. Dry gas can also be injected under the down stream baffle so as to facilitate the use of another injector in series with the first.

In accordance with another aspect of this invention, a crystal growth inhibiting gas is introduced at the nucleation site in such manner that it flows out an exhaust port and not under the injector. This aids in altering the properties of the initial "seed" crystals at the nucleation site so as to permit the formation of a smoother metal oxide film without reducing its bulk rate of growth.

BRIEF DESCRIPTION OF THE DRAWINGS

The invention is described with reference to the following drawings in which corresponding features are identified by the same reference designation, wherein:

FIG. 2A is a cross section of a film formed when undesirable "seed" crystallites are formed at the nucleation site in accordance with the prior art.

FIG. 2B is a cross section of a film formed when desirable "seed" crystallites are formed at the nucleation site in accordance with this invention.

DETAILED DESCRIPTION OF THE INVENTION

Figure 1:
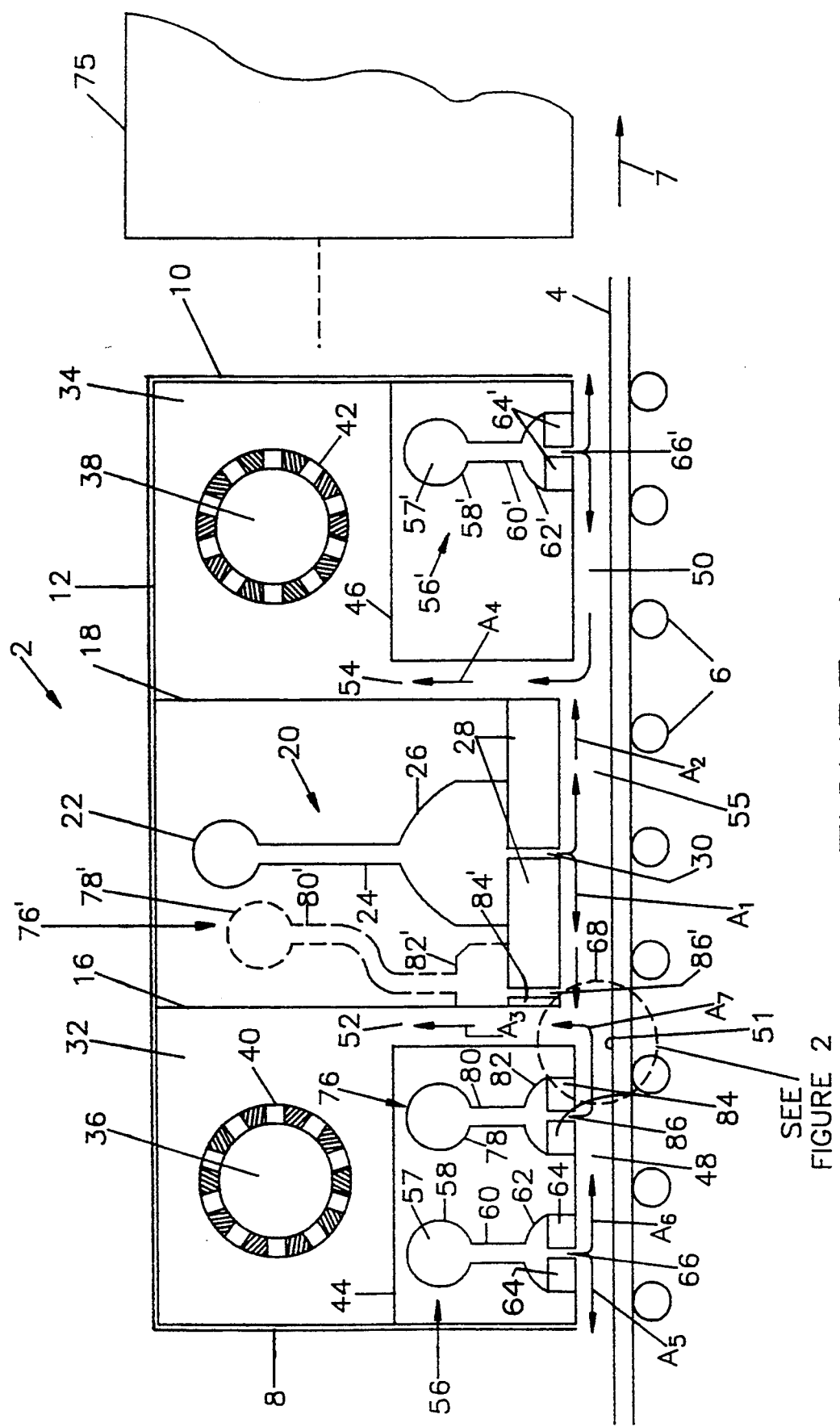
FIG. 1 is a side view of a side loading furnace incorporating the invention in which the metal oxide film is formed by chemical vapor deposition.

FIG. 1 is a side view of a deposition system 2 with the near side removed. A substrate 4 rests on rollers 6 that are distributed along the underside of a furnace (not shown) containing deposition system 2. It is moved from left to right as indicated by an arrow 7 by means of rollers 6. The deposition system 2 is in the form of a rectangular box having end walls 8 and 10, a top 12, a far side wall (not shown), and a front wall (not shown), and resides within a furnace heated by any suitable means.

Insulated walls 16 and 18 that are transverse to the direction in which substrate 4 is moving house an injector 20 of deposition or reactant vapors. The injector 20 is comprised of a slightly above atmospheric pressure reactant source 22 of such vapors, a conduit 24 and a distribution chamber 26 that extends across the entire width of the substrate 4. An injector head base 28 that is attached to the bottom of the distribution chamber 26 is provided with a slit 30 that extends across the substrate 4. The injector head base 28 is cooled by means not shown so as to inhibit the formation of the tin oxide film thereon.

Exhaust compartments 32 and 34 are respectively formed between the wall 16 of the injector housing and the end wall 8 of the deposition system 2, and between the wall 18 of the injector housing and the end wall 10 of the deposition system 2. Exhaust ports 36 and 38 for the exhaust compartments 32 and 34, respectively, are located in the far side wall 14 and respectively connected to perforated cylinders 40 and 42 that extend across the width of the deposition system 2. Baffles 44 and 46 that are respectively under the cylinders 40 and 42 form passageways 48 and 50 above the substrate 4 that extend across the latter's entire width. Between the baffle 44 and the wall 16 of the injector housing is an exhaust passageway 52 leading to the exhaust compartment 32, and between the baffle 46 and the wall 18 of the injector housing is another exhaust passageway 54 leading to the exhaust compartment 34. The exhaust passageways 52 and 54 extend across the entire width of the substrate 4. The deposition or reactant gases are drawn along the upstream half of a passageway 55 as indicated by an arrow $A_1$, and by-product gases and excess gases that do not form the oxide film are drawn through the exhaust passageway 52, as indicated by an arrow $A_3$. The deposition or reactant gases are also drawn along the downstream half of the passageway 55 as indicated by an arrow $A_2$, and by-product gases and excess gases that do not form the oxide film are drawn through the exhaust passageway 54 as indicated by an arrow $A_4$.

In accordance with one aspect of the invention, a source of dry gas, not shown, is coupled to an injector 56 via an opening 57 in the side wall, not shown, that is in turn coupled via conduits 58 and 60 to a distribution chamber 62. A base 64 having a slit 66 therein is connected to the bottom of the distribution chamber 62. At least the distribution chamber 62, the base 64 and the slit 66 extend across the entire width of the substrate 4. Dry gas emerging from the slit 66, with a pressure greater than atmospheric pressure, flows to the left in the passageway 48 as indicated by an arrow $A_5$ so as to prevent ambient air from entering the passageway 48. It also flows to the right as indicated by an arrow $A_6$, and is drawn into and along the exhaust passageway 52 as indicated by arrows $A_7$ and $A_3$, respectively. Accordingly, the dry gas flowing from injector 56 acts as "blocking gas", since it prevents ambient air from entering passageway 48, in this example.

If deposition gases such as tin tetrachloride are used, water vapor that is necessary for the reaction is provided by the source 22 in optimum concentration, but if gases such as tetramethyl tin, which do not require water vapor, are used, no water vapor is provided by the source 22.

Figure 2:
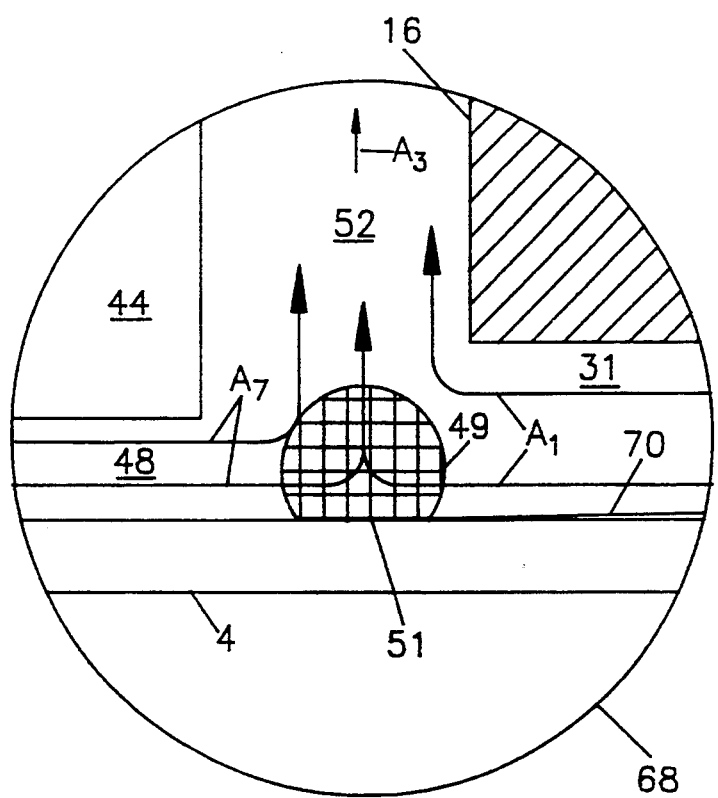
FIG. 2 is an enlargement of the nucleation site of FIG. 1.

Reference is now made to FIG. 2 which is an enlarged view of the portion of FIG. 1 shown in the dotted circle 68. The cross hatching indicates a nucleation zone 49 where the metal oxide crystals are first formed and deposited on a nucleation site 51 on the substrate 4 so as to start forming a metal oxide film 70. The nucleation site 51 is at the bottom of the exhaust passageway 52 within the nucleation zone 49. The inventor has discovered that when the dry gas injector 56 is omitted, as in the prior art, ambient air is drawn along the passageway 48 to the nucleation zone 49, potentially causing a many fold increase in the haziness and roughness of the resulting thick film 74 (see FIG. 2A). It is the inventor's discovery that the source of the increased roughness is the initial formation of undesirable "seed" crystallites at the nucleation site 51, as a result of moisture carried in by the ambient air. Once they are formed, these "seed" crystallites "program" or more correctly influence the growth of the film to yield large crystallites, that is, a rough film in portion 74 of the coating. This is illustrated in FIG. 2A, wherein the initial crystallites are shown at 72, and the thickest film at 74.

Depending on the humidity of the ambient air, the inventor determined that where tin tetrachloride is used as the source of tin for a tin oxide film, the roughness may be reduced to as much as one-third or more of its value when the ambient air is excluded from the nucleation zone by the injection of dry gas by the injector 56. In a preferred embodiment of the invention, the dry gas is metal free, and therefore a non-deposition gas. This is illustrated in FIG. 2B.

It is true that when tetramethyl tin is used as the source of tin, the deleterious effect of moist ambient air at the nucleation zone 49 is less pronounced. Nonetheless, some reduction in roughness may be obtained when ambient air is excluded in accordance with the invention.

In order to further ensure that ambient air is not drawn into the passageway 55 where the film is being formed, another dry gas injector 56', having the same components as the dry gas injector 56 that are indicated by the same respective numbers primed, may be located in the baffle 46. This injector 56' would be especially advantageous if another deposition system 75 is operated in series with and adjacent to the deposition system 2.

In accordance with another aspect of the invention, a gas is introduced only in the nucleation zone 49 of the coating process that promotes the growth of desirable "seed" crystallites so as to further decrease the size of the final crystallites formed, thereby producing a smoother film. Note that this gas could be introduced with the reactant gases via reactant source 22. However, it is not always advantageous to introduce this gas at that location, especially in large quantities, since those gases which tend to help yield smoother films also tend to inhibit the growth rate. Thus, introduction of the gas via reactant source 22 has the undesirable property of inhibiting the bulk film growth rate, thereby making it more difficult to obtain a film 74 of adequate thickness. In contrast, introduction of the gas only in the nucleation zone 49 of the coating process, as explained below, does not inhibit the bulk film growth rate. An example of a gas that may be used to improve the "seed" crystallites is methyl alcohol. Typically, the efficacy of methyl alcohol in suppressing film growth is improved in the presence of an oxidizing agent, such as oxygen. Other examples are the fluorine containing compounds used to dope the tin oxide such as 1, 1-difluoroethane. The latter compounds are used in the reactant gas mixture at 22. However, excessive amounts needed to produce smoother films without appreciable doping benefits are avoided by this aspect of the invention. The decreased roughness is particularly noticeable where tin tetrachloride is the source of tin.

Two ways of introducing the gas for improving the "seed" crystallites at the nucleation site are shown in FIG. 1. The first way is to locate an injector 76 on the other side of the nucleation site from the injector 20 so that the exhaust passageway 52 is between them. The injector 76 may be constructed in the same way as the injectors 56 and 56' so that it has a source 78 of gas under pressure, a conduit 80, a distribution chamber 82, a base 84 and a slit 86. The growth inhibiting gas follows the arrow $A_7$ into the nucleation zone 49 that is aligned with and along the exhaust passageway 52 as indicated by the arrow $A_3$ and into the exhaust port 36. Thus, the growth inhibiting gas is present at the nucleation site, but it does not enter the passageway 55 under the injector 20 where the bulk of the oxide film is produced.

Alternatively, the growth inhibiting gas can be introduced to the nucleation site by an injector 76' that is shown in dashed lines and located between the wall 16 and the deposition gas injector 20. The parts of the injector 76' corresponding to the injector 76 are indicated by the same numerals primed. The growth inhibiting gas that emerges from the slit 86' is swept into the exhaust passageway 52 along with the excess deposition gases emanating from the slit 30 of the deposition gas injector 20.

Figure 3:
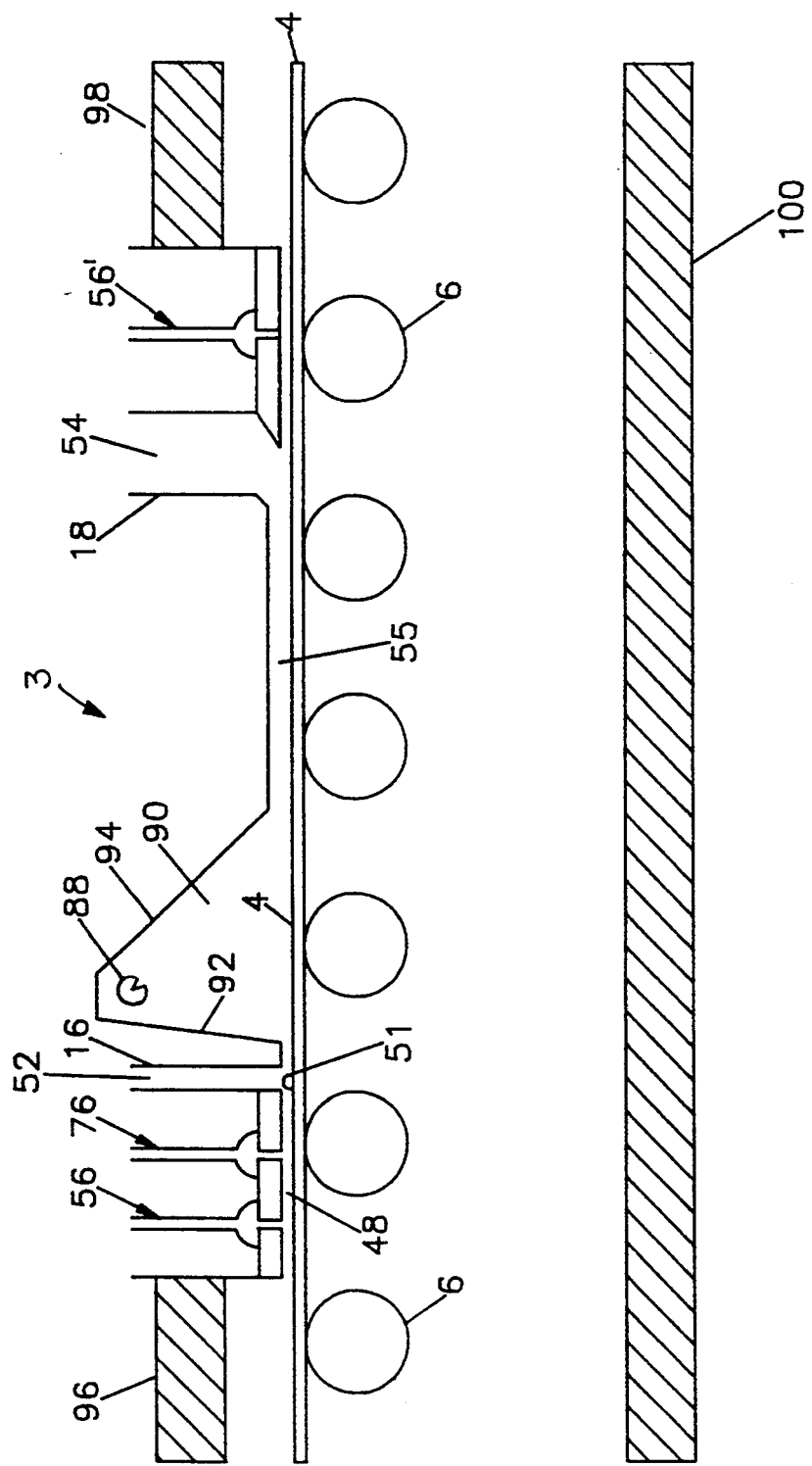
FIG. 3 is a side view of a furnace incorporating the invention in which the metal oxide film is formed by spray pyrolysis.

FIG. 3 is a side view of part of a furnace showing a deposition system 3 in which the reactants are delivered by a spray nozzle 88 that may shuttle back and forth across the substrate 4. In the interest of clarity, only numerals for major components are shown. The upper portion of the furnace in FIG. 3 is not shown since it may be a type where the reactant injector is loaded from the side as in FIG. 1 or from the top, but these details are of no importance to the invention. The spray nozzle 88 is at the narrow upper end of a generally V shaped chamber 90 formed by walls 92 and 94 that extend across the substrate 4 at a point nearer the wall 16 than the wall 18, and the downstream exhaust port 54 is wider than upstream exhaust port 52. Insulating walls 96, 98 and 100 are provided to reduce heat loss from the furnace.

The operation of FIG. 3 insofar as the invention is concerned is the same as in FIG. 1. The dry gas injector 56 prevents the ambient air from entering the passageway 48, and the growth inhibiting gas injector 76 introduces this gas into the nucleation zone 49 that is typically in the vicinity of the base of the exhaust passageway 52. As in FIG. 1, the dry gas injector 56' is especially useful if another reactant injector is used in series.

Figure 4:
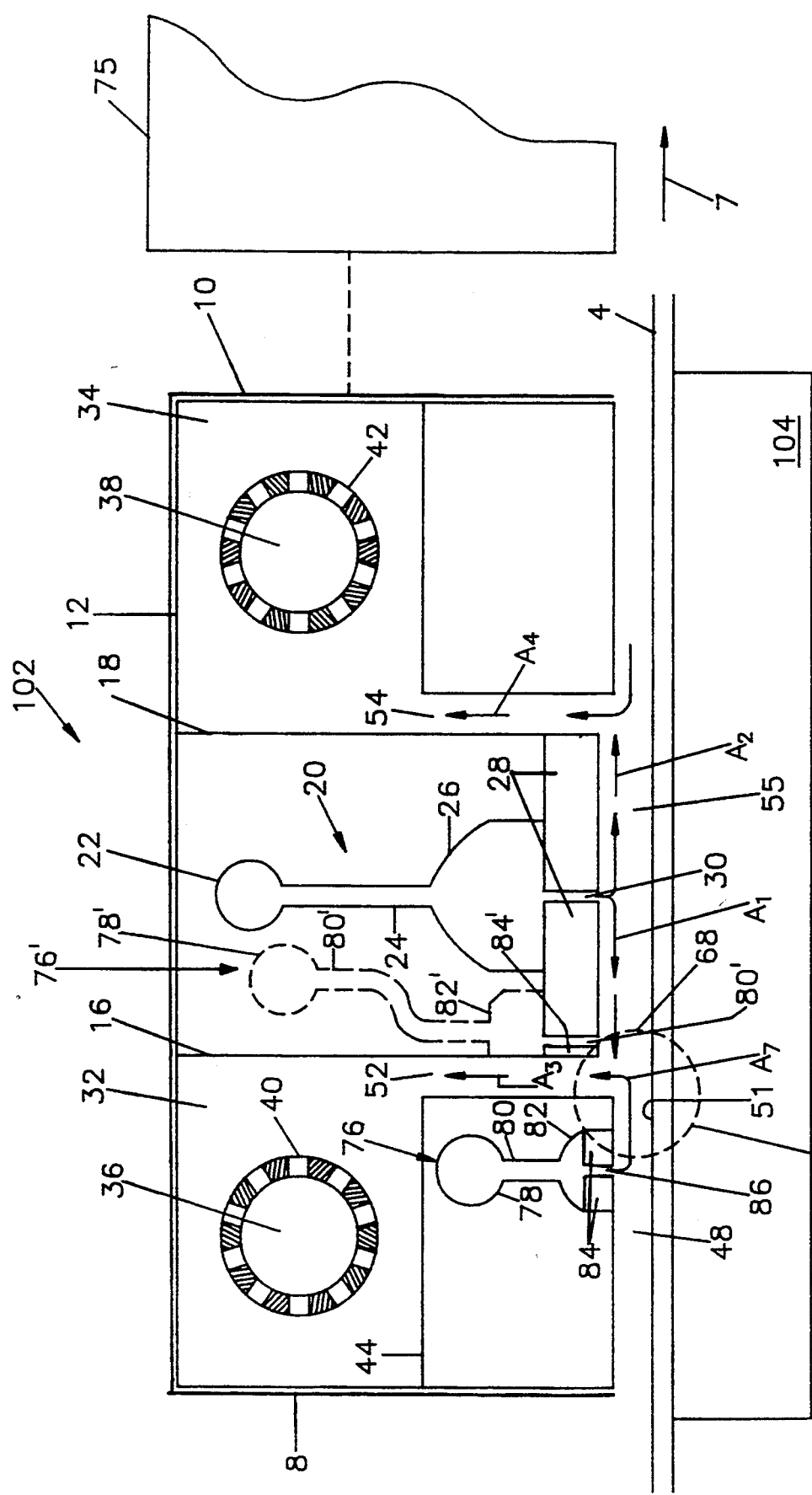
FIG. 4 is a side view of a furnace in which the substrate rides on molten metal and growth inhibitor gas is introduced at the nucleation site in accordance with this invention.

Reference is made to FIG. 4 showing a furnace 102 in which a substrate 4 floats on molten tin, not shown, in a trough 104, and a reducing atmosphere such as nitrogen plus a few percent hydrogen is injected into the furnace 102 by means not shown so as to prevent ambient air from oxidizing the molten tin. The internal details of the furnace are the same as in FIG. 1 except for the fact that the dry air injectors 56 and 56' are omitted. They are not required because the reducing atmosphere gas prevents the ambient air from reaching the nucleation site 51 at the bottom of the exhaust passageway 52. The internal details of the furnace could also be the same as in FIG. 3 except for the fact that the dry air injectors are not needed for the reason given. In either case, one of the injectors 76 or 76' for crystal growth inhibiting gas is retained so as to introduce a growth inhibiting gas such as methyl alcohol to the nucleation site 51 for the reasons discussed.

A technical discussion now follows for giving greater details and explanations of the present inventor's discoveries. In the deposition of tin oxide from tin tetrachloride vapor and water vapor, let $[SnCl_4]_{DG}$ = the concentration of tin chloride in the deposition gases $[H_2O]_{DG}$ = the concentration of water vapor in the deposition gases $[H_2O]_{AA}$ = the concentration of water vapor in the ambient air $f_{DG}$ = flow rate of deposition gases in exhaust system $f_{AA}$ = flow rate of ambient air drawn into exhaust system In the deposition of low haze tin oxide films, the present inventor discovered that the concentration of water vapor to tin chloride vapor should be about 2 or less, as shown below in equation (1):

$$\frac{[H_2O]_{DG}}{[SnCl_4]_{DG}} \leq 2 \quad (1)$$

As the deposition gases exit the slot above the substrate and move to the outer edges of the injector head, the concentrations of water and tin chloride decrease because they are being used up to make tin oxide. However, the ratio of their concentration stays less than or equal to 2 if their initial ratio is less than or equal to 2, since for each tin chloride molecule two molecules of water are used.

In the vicinity of the critical nucleation site, the water concentration, $[H_2O]$, is as shown below in equation (2):

$$[H_2O] = [H_2O]_{DG} \cdot \frac{f_{DG}}{f_{DG} + f_{AA}} + [H_2O]_{AA} \cdot \frac{f_{AA}}{f_{DG} + f_{AA}} \quad (2)$$

where the first term is the contribution of water vapor from the deposition gases diluted by the mixing of the deposition gases with the ambient air drawn into this region before passing into the exhaust system. The second term is the contribution of the water vapor in the ambient air diluted by its mixing with the deposition gases.

In the vicinity of the critical nucleation site, the tin chloride concentration, $[SnCl_4]$, is as shown in equation (3):

$$[SnCl_4] = [SnCl_4]_{DG} \cdot \frac{f_{DG}}{f_{DG} + f_{AA}} \quad (3)$$

In the vicinity of the critical nucleation site, the ratio of the water concentration to the tin chloride concentration is as shown below in equation (4):

$$\frac{[H_2O]}{[SnCl_4]} = \frac{[H_2O]_{DG}}{[SnCl_4]_{DG}} + \frac{[H_2O]_{AA}}{[SnCl_4]_{DG}} \cdot \frac{f_{AA}}{f_{DG}} \quad (4)$$

The first term is about 2 or less and consequently is not a problem as to hazing. In the second term, the water vapor concentration in ambient air is of the same magnitude as the reduced tin chloride concentration in the deposition gases (recall it is smaller than its initial concentration since it is used up in the deposition process), that is, this part of the ratio is around 1 (on dry days it would be somewhat less than 1 and on humid days it would be somewhat greater than 1). However, in general $f_{AA}$ is much greater than $f_{DG}$. The reason for this is that $f_{DG}$ is independent of the exhaust pressure, and is equal to the flow rate at the deposition gases, while $f_{AA}$ is not restricted and increases as the exhaust pressure increases. For example, it may easily be 50 times greater. Thus, in general, the second term is much greater than 2. As a result, nascent crystallites are produced which yield rough or very rough films.

In the prior art for atmospheric pressure chemical vapor deposition (APCVD) using a moving substrate consisting of soda lime glass previously coated with a thin layer of silicon dioxide, to deposit a tin oxide film from tin tetrachloride the following deposition conditions typically may be used: (1) substrate is preheated to 590° C. as it moves to the deposition zone while traveling at 2 feet per minute (2) Exhaust pressure is 0.3 mm Hg below atmospheric pressure, (3) The deposition gas is 2% (by volume or equivalently by mole fraction) tin tetrachloride, 4% water vapor, 4% 1,1 difluoroethane, and the balance is nitrogen, and (4) the total flow rate per foot of deposition width is about 12 liter per minute. To decrease the haze of this film the difluoroethane flow rate can be increased. This also reduces the film thickness and slightly improves the film conductivity. Alternatively, to decrease the haze the water concentration may be slightly reduced. However, this also reduces the film thickness. On humid days the resulting film would have a haze about 5% or greater. Varying the difuoroethane and water concentration as explained above and slowing the traveling rate of the substrate to about 1.8 feet per minute to preserve adequate film thickness may reduce the haze to around 4%. On drier days the haze may be around 2–3%. Thus a product with poor haze control is obtained since the haze varies as the atmospheric humidity changes. In addition, it is difficult to obtain low haze.

In the present invention the deposition conditions are as indicated in the prior art. However, in the present invention ambient air with its uncontrolled moisture content is now prevented from entering the region of the nucleation site with a dry blocking gas 57. The haze no longer varies as the ambient humidity changes. Furthermore it is reduced to about 1%.

In another embodiment of the invention, if controlled haze films are desired with haze greater than 1%, then a controlled amount of water vapor is either directly added to the blocking gas, or is added where it either mixes with the blocking gas, or where it mixes with the deposition gases just before they reach the nucleation site 51, as shown in FIG. 1. If 5% haze is desired, then the blocking gas is about 2% water vapor. For lower haze less water vapor is added to the blocking gas. For higher haze more water vapor is added to the blocking gas. In this manner, control over the total concentration of water vapor at the nucleating site or area is obtained, in that as in the prior art the amount of water vapor in the deposition gas is also controlled.

If haze substantially less than 1% is desired, a growth inhibiting gas may be added as shown in FIG. 1, and as previously described. In this case the blocking gas is air with 0.5% methanol. To tailor the properties of the crystallites for special applications, both water vapor and an inhibiting gas may be used. Note that the use of methanol to reduce haze is effective in the presence of oxidizing agents, such as oxygen in air, for example.

Although various embodiments of the present invention are shown and described herein, they are not meant to be limiting. Those of skill in the art may recognize certain modifications to these embodiments, which modifications are meant to be covered by the spirit and scope of the appended claims. For Example, as indicated above, where haze is desired such as for amorphous silicon photovoltaic cells, applicant has discovered that when the deposition gas is 2% (by volume or equivalently by mole fraction) tin tetrachloride, 4% water vapor, 4% 1,1 difloroethane, with the balance being nitrogen, and blocking gas, entering the exhaust being provided at 2% water vapor, this results in a tin oxide film of about 5% haze if the film is at least 0.5 micrometers thick. In actual practice, air entering the exhaust may need a somewhat higher or lower concentration of water vapor depending upon the exhaust pressure (or flow rate) and injector head design.

What is claimed is:

1. A method for controlling or varying at a nucleation site, haze in forming a film of metal oxide on a substrate comprising the steps of:

moving the substrate through a deposition system;

bringing reactants for forming the film into contact with an area of the substrate within the deposition system; and controlling or varying the formation of nascent crystallites in said film as it is being formed at said nucleation site, said crystallites affecting the roughness or haze of the film, by injecting a blocking gas into the region between the nucleation site and the side of the area where the substrate enters the deposition system, to block or prevent ambient air with uncontrolled water vapor from entering the nucleation site, and by controlling the level of concentration of water vapor in the blocking gas to control the total concentration of water vapor at the nucleation site.

2. The method of claim 1, further including the step of injecting said blocking gas having a controlled level of concentration of water vapor into passageways of an associated deposition system, proximate where ambient air may enter into said passageways, at a pressure sufficient for blocking the ambient air from entering any area along said substrate where it is exposed to said reactants.

3. A method for controlling or varying haze in forming a metal oxide film on a substrate moving through a deposition system including passageways that permit ambient air to enter into a nucleating area where reactants for forming said film are introduced to said substrate, said ambient air carrying an uncontrolled concentration of moisture into said nucleating area causing nascent crystallites to form which cause uncontrolled roughness or hazing of said film, said method comprising the steps of:

injecting a blocking gas having a controlled concentration of water vapor into said passageways at a pressure sufficient to block ambient air from entering into said nucleating area, for controlling the total concentration of water vapor at the nucleating area, for in turn controlling the formation of said nascent crystallites in the film being formed, thereby controlling or selectively varying the haze or roughness of the film; and injecting a film growth inhibiting gas into a region of initial film growth on said substrate, for further controlling the hazing or roughness of the film being formed.

4. The method of claim 3, wherein said film growth inhibiting gas is a fluorocarbon.

5. The method of claim 3, wherein said reactants produce a metal oxide film of tin oxide, and said film growth inhibiting gas is selected from a family of fluorocarbons including 1,1-difluoroethane.

6. The method of claim 3, wherein said film growth inhibiting gas includes an alcohol.

7. The method of claim 6, wherein said film growth inhibiting gas further includes an oxidizing agent.

8. The method of claim 3, wherein methanol is included in said film growth inhibiting gas.

9. The method of claim 8, wherein said film growth inhibiting gas further includes an oxidizing agent.

10. The method of claim 3, wherein water vapor and a tin chloride are included in said reactants.

11. The method of claim 3, wherein a mixture of water vapor and dimethyl tin dichloride are included in said reactants.

12. The method of claim 3, wherein a mixture of water vapor and tin tetrachloride are included in said reactants.

13. The method of claim 3, wherein an organotin is included in said reactants.

14. The method of claim 3, wherein tetramethyl tin is included as one of said reactants.

* * * * *